United States Patent
Nelson et al.

(10) Patent No.: US 8,843,794 B2
(45) Date of Patent: Sep. 23, 2014

(54) METHOD, SYSTEM AND APPARATUS FOR EVALUATION OF INPUT/OUTPUT BUFFER CIRCUITRY

(71) Applicants: Christopher J. Nelson, Gilbert, AZ (US); Tak M. Mak, Union City, CA (US); David J. Zimmerman, El Dorado Hills, CA (US); Pete D. Vogt, Boulder, CO (US)

(72) Inventors: Christopher J. Nelson, Gilbert, AZ (US); Tak M. Mak, Union City, CA (US); David J. Zimmerman, El Dorado Hills, CA (US); Pete D. Vogt, Boulder, CO (US)

(73) Assignee: Intel Corporation, Santa Clara, CA (US)

( * ) Notice: Subject to any disclaimer, the term of this patent is extended or adjusted under 35 U.S.C. 154(b) by 148 days.

(21) Appl. No.: 13/625,744

(22) Filed: Sep. 24, 2012

(65) Prior Publication Data

US 2014/0089752 A1 Mar. 27, 2014

(51) Int. Cl.
*G01R 31/28* (2006.01)
*G06F 11/00* (2006.01)
(Continued)

(52) U.S. Cl.
CPC .......... *G01R 31/31716* (2013.01); *G11C 29/02* (2013.01); *G01R 31/3187* (2013.01); *G06F 11/3485* (2013.01); *G11C 7/10* (2013.01); *G11C 29/1201* (2013.01); *G11C 29/022* (2013.01); *H04L 1/243* (2013.01); *G01R 31/3177* (2013.01); *G01R 31/3181* (2013.01); *G11C 29/32* (2013.01)
USPC ........... 714/716; 714/700; 714/717; 714/724; 714/726; 714/727; 714/731; 714/735; 714/742; 714/744; 370/249; 713/401; 702/58; 702/108; 702/117; 702/118; 702/120; 702/125; 710/25; 710/58; 710/1; 711/105

(58) Field of Classification Search
CPC ..................... G01R 31/31716; G01R 31/3177; G01R 31/3181; G01R 31/3187; G11C 29/022; G11C 29/02; G11C 29/1201; G11C 7/10; G11C 29/32; G06F 11/3485; H04L 1/243
USPC ......... 714/716, 700, 717, 724, 726, 727, 731, 714/735, 742, 744; 370/249; 713/401; 702/58, 108, 117, 118, 120, 125; 710/25, 58, 1; 711/105
See application file for complete search history.

(56) References Cited

U.S. PATENT DOCUMENTS 5,586,123 A 12/1996 Baker
5,621,739 A 4/1997 Sine et al.
(Continued)

FOREIGN PATENT DOCUMENTS

KR 10-2011-0052205 5/2011

OTHER PUBLICATIONS

Tripp, M., ""Elimination of traditional functional testing of interface timings at Intel", International Test Conference, 2004, IEEE,", (2004), pp. 1448-1456.

(Continued)

*Primary Examiner* — John J Tabone, Jr.
(74) *Attorney, Agent, or Firm* — Blakely, Sokoloff, Taylor & Zafman LLP

(57) ABSTRACT

Techniques and mechanisms for evaluating I/O buffer circuits. In an embodiment, test rounds are performed for a device including the I/O buffer circuits, each of the test rounds comprising a respective loop-back test for each of the I/O buffer circuits. Each of the test rounds corresponds to a different respective delay between a transmit clock signal and a receive clock signal. In another embodiment, a first test round indicates a failure condition for at least one I/O buffer circuit and a second test round indicates the failure condition for each of the I/O buffer circuits. Evaluation of the I/O buffer circuits determines whether the device satisfies a test condition, where the determining is based on a difference between the delay corresponding to the first test round and the delay corresponding to the second test round.

30 Claims, 8 Drawing Sheets

(51) Int. Cl.

| | | |
|---|---|---|
| *G06F 13/42* | (2006.01) | |
| *G01R 31/00* | (2006.01) | |
| *G06F 13/00* | (2006.01) | |
| *G01R 31/317* | (2006.01) | |
| *G11C 29/02* | (2006.01) | |
| *G01R 31/3187* | (2006.01) | |
| *G06F 11/34* | (2006.01) | |
| *G11C 7/10* | (2006.01) | |
| *G11C 29/12* | (2006.01) | |
| *H04L 1/24* | (2006.01) | |
| *G01R 31/3177* | (2006.01) | |
| *G01R 31/3181* | (2006.01) | |
| *G11C 29/32* | (2006.01) | |

(56) References Cited

U.S. PATENT DOCUMENTS

| | | | | |
|---|---|---|---|---|
| 5,869,983 | A | | 2/1999 | Ilkbahar et al. |
| 6,348,811 | B1 | | 2/2002 | Haycock et al. |
| 6,348,826 | B1 | | 2/2002 | Mooney et al. |
| 6,424,926 | B1 | | 7/2002 | Mak |
| 6,477,674 | B1 | * | 11/2002 | Bates et al. ............ 714/738 |
| 6,629,274 | B1 | * | 9/2003 | Tripp et al. ............ 714/721 |
| 6,671,847 | B1 | | 12/2003 | Chao et al. |
| 6,889,350 | B2 | * | 5/2005 | Fought et al. ............ 714/745 |
| 6,898,741 | B2 | * | 5/2005 | Muljono et al. ............ 714/700 |
| 6,975,954 | B2 | | 12/2005 | Mak et al. |
| 7,002,365 | B2 | | 2/2006 | Kakizawa et al. |
| 7,036,055 | B2 | * | 4/2006 | Muljono et al. ............ 714/716 |
| 7,139,957 | B2 | * | 11/2006 | Querbach et al. ............ 714/745 |
| 7,188,284 | B2 | | 3/2007 | Mitra et al. |
| 7,228,515 | B2 | * | 6/2007 | Querbach et al. ............ 716/108 |
| 7,496,803 | B2 | * | 2/2009 | Khondker et al. ............ 714/700 |
| 7,519,891 | B2 | | 4/2009 | Zimmerman |
| 8,432,768 | B2 | * | 4/2013 | Ware et al. ............ 365/233.1 |
| 2002/0184581 | A1 | | 12/2002 | Komatsu |
| 2003/0005374 | A1 | | 1/2003 | Fought et al. |
| 2003/0120989 | A1 | | 6/2003 | Zumkehr |
| 2006/0236183 | A1 | | 10/2006 | Zerbe et al. |
| 2007/0291830 | A1 | | 12/2007 | Hori |
| 2008/0205170 | A1 | * | 8/2008 | Ikeda ............ 365/193 |
| 2009/0103443 | A1 | * | 4/2009 | Ku et al. ............ 370/249 |
| 2010/0017662 | A1 | | 1/2010 | Miller |
| 2014/0046616 | A1 | * | 2/2014 | Cheng ............ 702/120 |

OTHER PUBLICATIONS

"PCT, International Search Report and Written Opinion of the International Searching Authority for International Application No. PCT/US2013/046198", (Nov. 25, 2013), Whole Document.

"PCT, International Search Report and Written Opinion of the International Searching Authority for International Application No. PCT/US2013/045796", (Sep. 24, 2013), Whole Document.

* cited by examiner

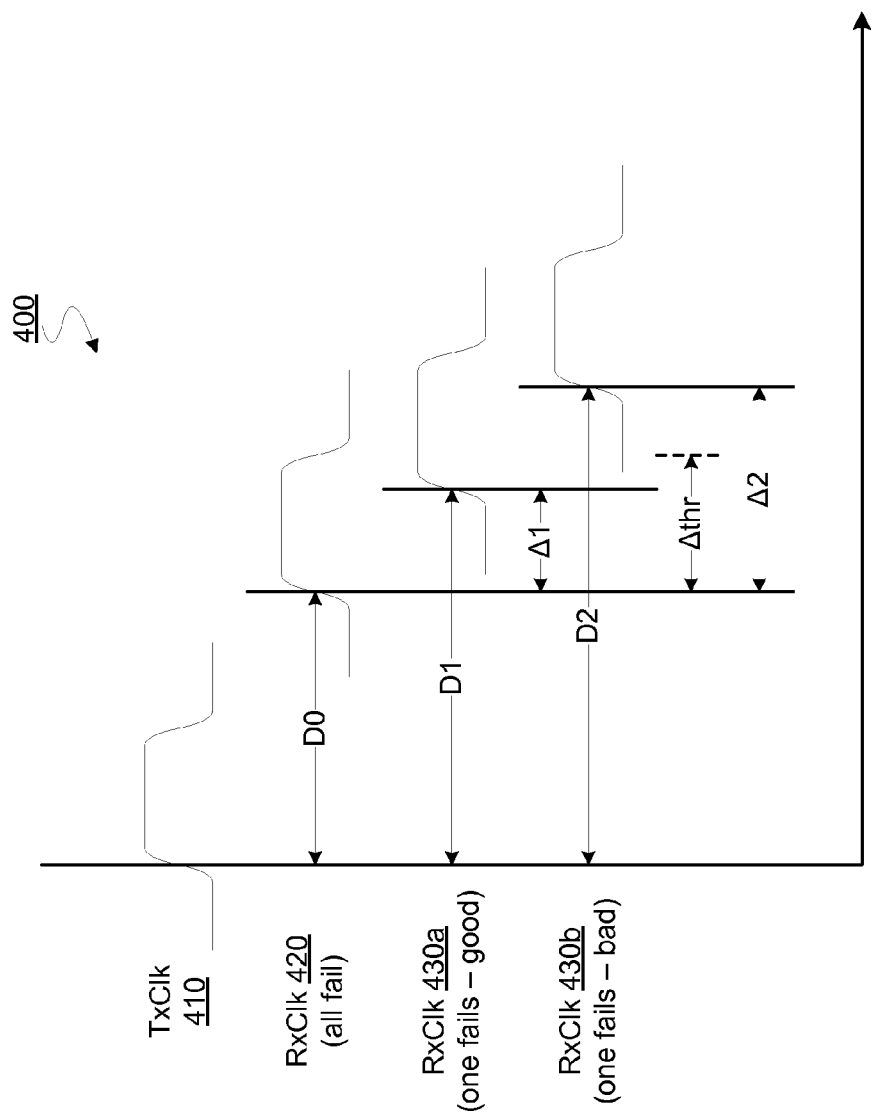

METHOD, SYSTEM AND APPARATUS FOR EVALUATION OF INPUT/OUTPUT BUFFER CIRCUITRY

BACKGROUND

1. Technical Field

The present invention pertains generally to the field of integrated circuits. More specifically, certain embodiments relate to the testing of buffer circuits on integrated circuits.

2. Background Art

Contemporary schemes for verifying operation of an integrated circuit (IC) include I/O loopback testing for an input/output (I/O) buffer circuit of the IC. I/O loopback tests are typically carried out by driving data through an output component of an I/O buffer circuit of the IC, subsequently driving associated data back through an input component of the same I/O buffer circuit, and verifying whether the input data and output data correctly correspond to one another. Such I/O loopback testing aids in evaluation of whether the input and output components of the I/O buffer circuit are functioning properly.

As integrated circuit (IC) features continue to shrink, test costs relentlessly increase. Greater numbers of interface nodes, higher operating frequencies, and specialized packaging arrangements such as multi-chip modules all contribute to soaring test costs. To avoid wasting packaging materials and assembly costs, some tests are performed on an integrated circuit die prior to package assembly. Equipment for testing integrated circuits before assembly increases in cost and complexity as die contacts decrease in size and increase in number. Indeed, the cost of exhaustive pre-assembly testing of every interface node of an integrated circuit is becoming prohibitive. Unfortunately, saving costs by reducing pre-assembly testing translates into increasing post-assembly waste.

The number of I/O pins in the interfaces of upcoming generations of memory devices is expected to increase—e.g. from about 30 pins in some current dynamic random access memory (DRAM) devices to around 512-1024 DQ pins and around 8 channels of address and command pins. Even if all such pins could be probed during a wafer probe, it would be cost prohibitive for direct automatic test equipment (ATE) wafer probe testing. Moreover, wafer probe ATE and probe tooling are limited to about 500 MHz clock rates, which corresponds to 1 giga-transfers per second (1 GT/s) for double data rate (DDR) circuit testing. However, future memory devices are forecast to reach up to about 2 giga-transfers per second (GT/s) performance capability. For at least these reasons, the current state of the art for IC testing is inadequate for upcoming generations of devices.

BRIEF DESCRIPTION OF THE DRAWINGS

The various embodiments of the present invention are illustrated by way of example, and not by way of limitation, in the figures of the accompanying drawings and in which:

FIG. 4 is a timing diagram illustrating elements of clock delays during an evaluation of an integrated circuit according to an embodiment.

DETAILED DESCRIPTION

Embodiments discussed herein variously provide techniques and/or mechanisms to determine whether a plurality of I/O buffer circuits satisfy a test criterion. Certain embodiments test a plurality of I/O buffer circuits to detect for an abnormally large spread between a fastest operating I/O buffer circuit and a slowest operating I/O buffer circuit. Such a plurality of I/O buffer circuits may share one or more common clock signals. For example, respective data may be variously launched from each of the plurality of I/O buffer circuits with a common transmit clock signal. Alternatively or in addition, respective data may be variously received by each of the plurality of I/O buffer circuits with a common receive clock signal.

An embodiment performs rounds of loop-back tests for the plurality of I/O buffer circuits, where the rounds of loop-back tests are each performed during a different respective delay between the common transmit clock signal and the common receive clock signal. Automatic testing equipment operating according to an embodiment may facilitate such test rounds by providing fine (e.g. 10 pico-second) clock edge resolution—e.g. where requirements of edge placement accuracy may not need to be so stringent.

Evaluating a result of a test round may include determining, for each of the plurality of I/O buffer circuits, whether loop-back testing of the I/O buffer circuit indicates a fail condition. Based on such determining for each of the plurality of I/O buffer circuits, an output signal—e.g. one of an all-pass output signal, a single fail output signal and an all-fail output signal—may be provided to indicate failure of no I/O buffer circuits, failure of at least one I/O buffer circuit or failure of each of the plurality of I/O buffer circuits.

In an embodiment, the plurality of I/O buffer circuits are each included in an integrated circuit—e.g. where evaluation of the plurality of I/O buffer circuits is performed during wafer probe testing. For example, such evaluation may be performed when there are no package pins connected to the integrated circuit and/or when the integrated circuit resides on a die which has not yet been assembled with any other die. In another embodiment, the plurality of I/O buffer circuits may be so evaluated while in an assembly of multiple dies, while in a package, and/or the like.

Figure 1:
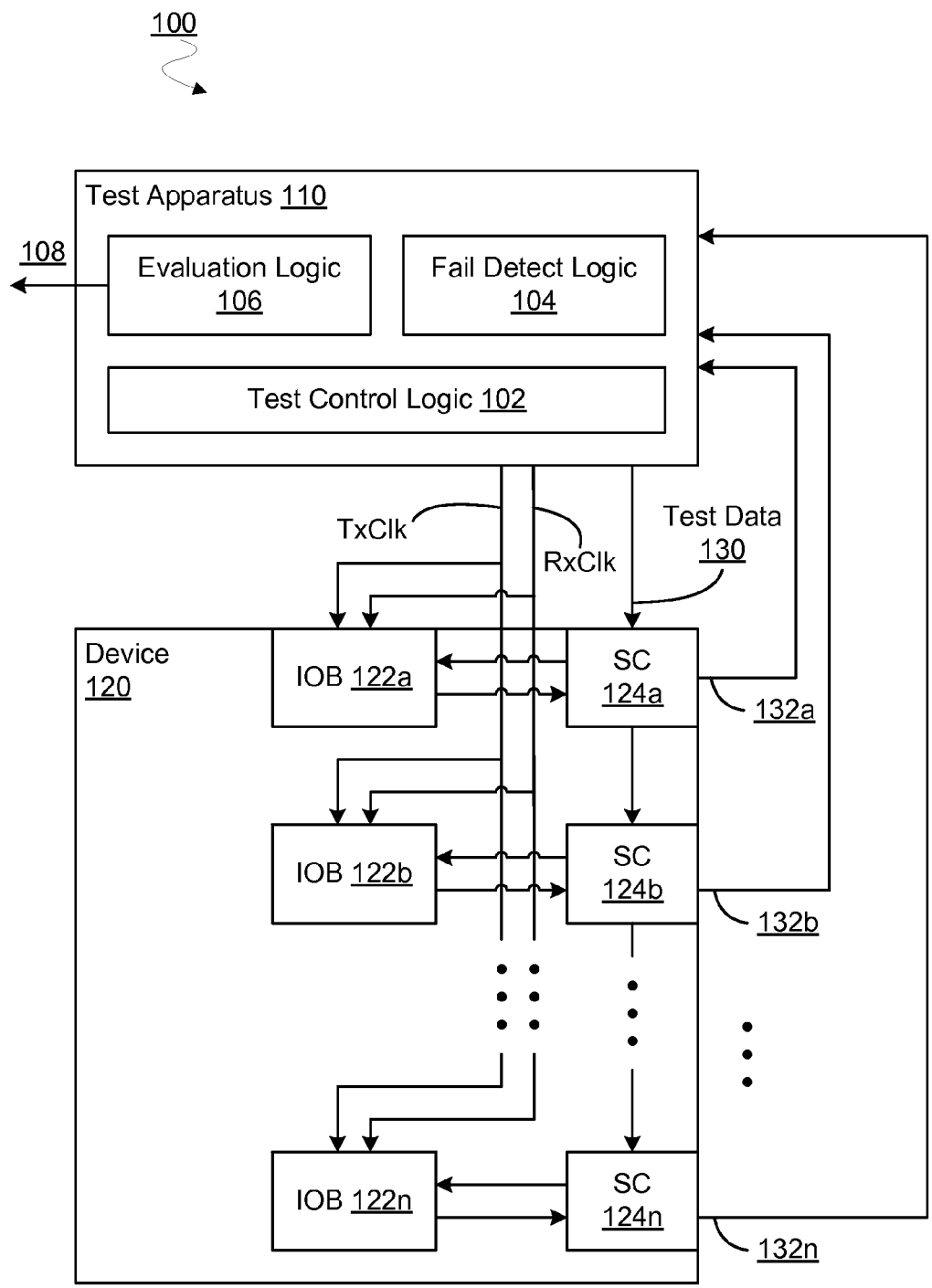
FIG. 1 is a block diagram illustrating elements of a system for evaluating an integrated circuit according to an embodiment.

FIG. 1 illustrates elements of a system 100 for testing an integrated circuit according to an embodiment. System 100 may include a test apparatus 110 and a device 120 including an integrated circuit (IC) which is subject to evaluation by test apparatus 110. In an alternate embodiment, the functionality of test apparatus 110 is implemented in multiple separate devices. Certain embodiments are implemented entirely within test apparatus 110, or entirely within such multiple separate devices to implement the functionality of test apparatus 110.

Device 120 may be an IC to be evaluated, a package including such an IC, a DIMM or other device including such a package and/or the like. The integrated circuit evaluated by test apparatus 110 may, for example, include random-access memory (RAM) such as one or more of dynamic RAM (DRAM), Double-Data-Rate DRAM (DDRAM), synchronous DRAM (SDRAM), static RAM (SRAM), flash memory, content addressable memory (CAM), polymer memory (e.g., ferroelectric polymer memory), phase-change memory (e.g., ovonic memory), silicon-oxide-nitride-oxide-silicon (SONOS) memory, or any other type of integrated circuit logic suitable for storing information.

In an embodiment, device 120 includes I/O buffer (IOB) circuits 122a, 122b, ..., 122n which, during normal (or "mission mode") operation of device 120, are to variously receive data for device 120 and/or send data from device 120. Evaluation of an integrated circuit of device 120 may include test apparatus 110 performing respective loop-back testing for each of IOB circuits 122a, 122b, ..., 122n. For example, test apparatus 110 may perform multiple loop-back tests for each of IOB circuits 122a, 122b, ..., 122n, each loop back test for a respective delay (or "skew") between a transmit clock and a receive clock which variously regulate respective operations of IOB circuits 122a, 122b, ..., 122n.

By way of illustration and not limitation, test apparatus 110 may comprise test control logic 102—e.g. including hardware, firmware and/or executing software—to provide test data 130 to scan chain (SC) modules 124a, 124b, ..., 124n. While SC modules 124a, 124b, ..., 124n are illustrated as being incorporated into device 120, certain embodiments are not limited in this regard. Based on test data 130, SC modules 124a, 124b, ..., 124n may each input various data to a different respective one of IOB circuits 122a, 122b, ..., 122n and each receive various associated output data from the different respective one of IOB circuits 122a, 122b, ..., 122n. For example, SC 124a may input respective data to IOB 122a, where such input is regulated by a transmit clock TxClk. Alternatively or in addition, SC 124a may receive from IOB 122a output data based on the input data, where such receiving is regulated by a receive clock RxClk. TxClk may regulate SC 124b inputting respective data to IOB 122b, regulate SC 124n inputting respective data to IOB 122n, and/or the like. Alternatively or in addition, RxClk may similarly regulate SC 124b receiving respective output data from IOB 122b, regulate SC 124n receiving respective output data from IOB 122n, and/or the like.

In an embodiment, test control logic 102 controls sending of a first set of data as part of test data 130, where the first set of data is a basis for a round of loop-back testing of IOB circuits 122a, 122b, ..., 122n which is performed while there is a first delay between TxClk and RxClk. Test control logic 102 may subsequently control sending of a second set of data as another part of test data 130, where the second set of data is a basis for a different round of loop-back testing of IOB circuits 122a, 122b, ..., 122n which is performed while there is a different delay between TxClk and RxClk. In an embodiment, test control logic 102 controls multiple such test rounds, where each test round is for a different respective delay between TxClk and RxClk.

Based on the various input data each for a respective one of IOB circuits 122a, 122b, ..., 122n and the various associated output each from a respective one of IOB 122a, SC modules 124a, 124b, ..., 124n may provide to test apparatus 110 information indicating respective loop-back test results for IOB circuits 122a, 122b, ..., 122n. By way of illustration and not limitation, SC 124a may provide output signal 132a, which is based on loop-back test exchanges between SC 124a and IOB 122a. Alternatively or in addition, test apparatus 110 may similarly receive output signal 132b based on loop-back test exchanges between SC 124b and IOB 122b, output signal 132n based on loop-back test exchanges between SC 124n and IOB 122n, and/or the like. Output signals 132a, 132b, ..., 132n may each include respective one or more values which are each for a different respective loop-back test of a given test round. Such one or more values of an output signal may be both specific to a particular test round and specific to a particular I/O buffer circuit variously tested during that test round. In another embodiment, output signals 132a, 132b, ..., 132n are additionally provided as feedback to the scan chain comprising SC modules 124a, 124b, ..., 124n.

Based on output signals 132a, 132b, ..., 132n, test apparatus 110 may evaluate whether device 120 satisfies one or more test criteria. By way of illustration and not limitation, test apparatus 110 may include fail detect logic 104—e.g. including hardware, firmware and/or executing software—to determine whether a fail condition is indicated by any of output signals 132a, 132b, ..., 132n. The fail condition may include an IOB module failing at least one of its loop-back tests in a test round. In an embodiment, the fail condition includes an IOB module failing each of its loop-back tests in a test round.

Fail detect logic 104 may determine that a first test round, associated with a first delay between TxClk and RxClk, indicates the failure condition for at least one of IOB circuits 122a, 122b, ..., 122n. Fail detect logic 104 may additionally or alternatively determine that a second test round, associated with a second delay between TxClk and RxClk, indicates instances of the failure condition for each of IOB circuits 122a, 122b, ..., 122n In an embodiment, test apparatus 110 includes evaluation logic 106 to calculate a difference between such a first delay and such a second delay. Based on such a difference, evaluation logic 106 may generate a signal 108 indicating whether device 120 satisfies a test criterion. For example, evaluation logic 106 may compare the calculated difference with a threshold difference value associated with devices which satisfy the test criterion. Signal 108 may be provided for storing corresponding data in a memory (not shown), for display of an evaluation result in a display unit, as a feedback signal for additional circuit testing, and/or the like.

Figure 2:
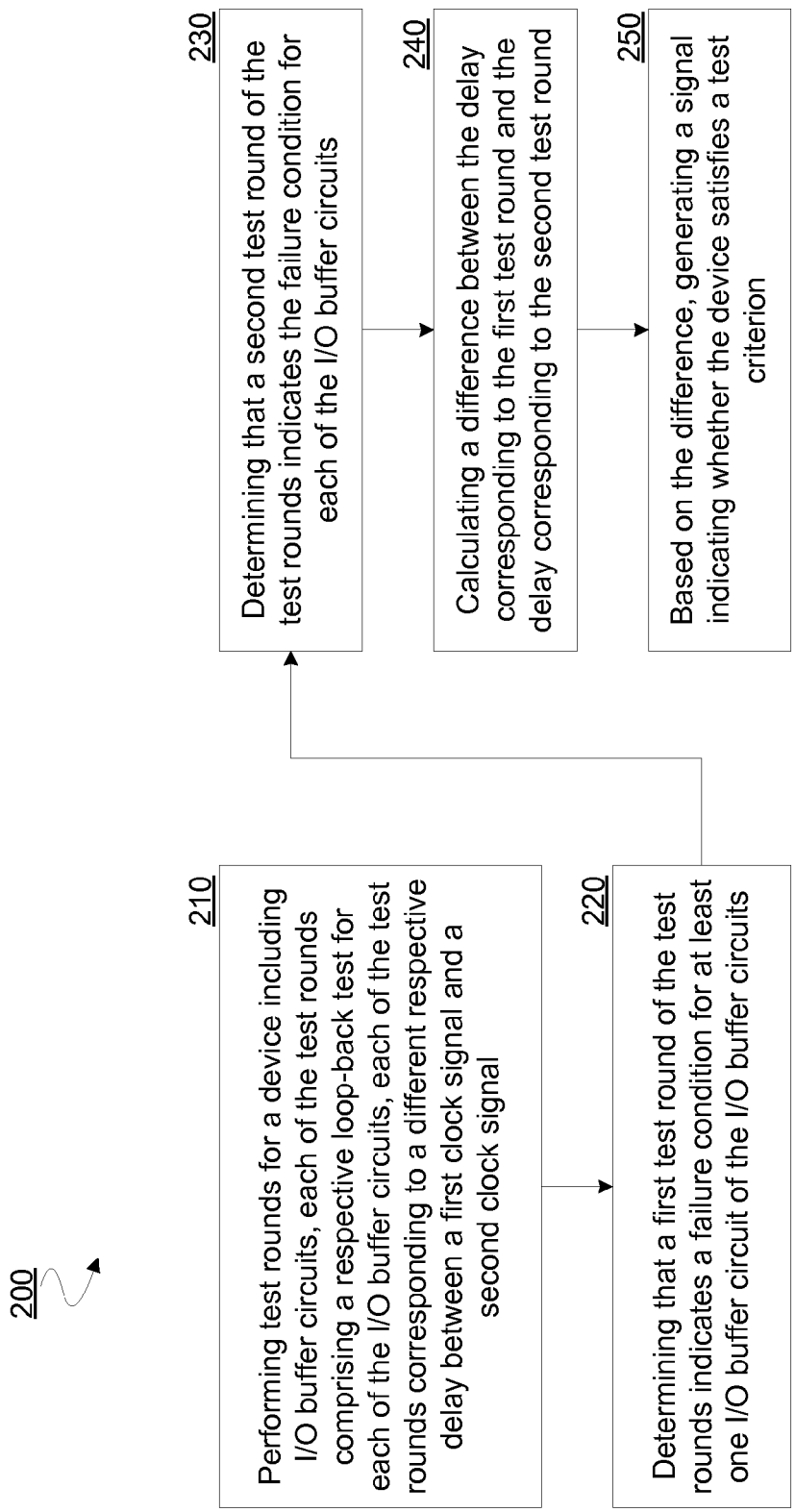
FIG. 2 is a flow diagram illustrating elements of a method for evaluating I/O buffer circuitry according to an embodiment.

FIG. 2 illustrates elements of a method 200 for evaluating an integrated circuit according to an embodiment. Method 200 may be performed to evaluate an integrated circuit such as that of device 120. Method 200 may be performed by circuit logic having some or all of the features of test apparatus 110.

In an embodiment, method 200 includes, at 210, performing test rounds for a device including I/O buffer circuits which each comprise a respective transmit path and a respective receive path. Each of the test rounds may comprise a respective loop-back test for each of the I/O buffer circuits, and/or each of the test rounds may correspond to a different respective delay between a first clock signal and a second clock signal. In an embodiment, the first clock signal is to regulate communication along the respective transmit paths of each of the I/O buffer circuits, and the second clock signal is to regulate communication along the respective receive paths of each of the I/O buffer circuits.

By way of illustration and not limitation, the test rounds performed at 210 may be for device 120—e.g. where a first test round includes a respective loop-back test for each of IOB circuitry 122a, 122b, ..., 122n. Such a first test round may include additional respective loop-back tests for each of IOB circuitry 122a, 122b, ..., 122n, although certain embodiments are not limited in this regard. For example, a test round may include multiple loop-back tests for a particular IOB circuit, where such multiple loop-back tests each provide various respective data values to that IOB circuit, and receive various respective output data from that IOB circuit.

Performing the test rounds at 210 may include control logic—e.g. test control logic 102—sending test data to a series of scan chain modules which each correspond to a respective one of the I/O buffer circuits. The series of scan chain modules may be incorporated into the device being evaluated, although certain embodiments are not limited in this regard. In an embodiment, the series of scan chain modules include mechanisms to operate as a linear feedback shift register (LFSR).

Method 200 may further include, at 220, determining that a first test round of the test rounds performed at 210 indicates a failure condition for at least one I/O buffer circuit of the I/O buffer circuits. For example, the first test round may include a first set of loop-back tests for a first I/O buffer circuit. In an embodiment, determining that the first test round indicates the failure condition for the at least one I/O buffer circuit includes detection logic—e.g. fail detect logic 104—determining that the first test round indicates failure for each of the first set of loop-back tests. In such an embodiment, determining that the first test round indicates the failure condition for the at least one I/O buffer circuit may include such detection logic further determining that at least one other I/O buffer circuit has not failed each of its respective loop-back tests for the first test round.

In an alternate embodiment, determining that the first test round indicates the failure condition for the at least one I/O buffer circuit includes determining that the first test round indicates failure of at least one of the first set of loop-back tests. In such an embodiment, determining that the first test round indicates the failure condition for the at least one I/O buffer circuit may include further determining that at least one other I/O buffer circuit has not failed any of its respective loop-back tests of the first test round.

For a given loop-back test for a particular I/O buffer circuit in a given test round, failure of the loop-back test may include a failure of the I/O buffer circuit to provide an output data signal correctly corresponding to—e.g. equal to—an input data signal received by the I/O buffer circuit for that loop-back test. Such a failure may include the I/O buffer circuit providing an incorrect output data signal and/or the I/O buffer circuit providing a correct output data signal at an incorrect time (e.g. such as after an unacceptable delay).

Method 200 may further include, at 230, determining that a second test round of the test rounds indicates the failure condition for each of the I/O buffer circuits. For example, the determining at 230 may include detection logic—e.g. fail detect logic 104—determining that each of the I/O buffer circuits has failed each of its respective loop-back tests of the second test round. In another embodiment, the determining at 230 includes determining that each of the I/O buffer circuits has failed at least one respective loop-back test of the second test round.

Method 200 may further include, at 240, calculating a difference between the delay corresponding to the first test round and the delay corresponding to the second test round. By way of illustration and not limitation, fail detect logic 104 may provide information associated with the first test round to evaluation logic 106 in response to determining at 220, and further provide information associated with the second test round to evaluation logic 106 in response to determining at 230. Such information may, for example, identify the first test round and the second test round and/or respective clock delay information for each of the first test round and the second test round. Based on such information, evaluation logic 106 may directly or indirectly determine, for each of the first test round and the second test round, the respective delay between the first clock signal and the second clock signal, and calculate a difference between such respective delays.

Based on the difference calculated at 240, method 200 may generate, at 250, signal indicating whether the device satisfies a test criterion. For example, the generating at 250 may include accessing reference information describing a threshold difference between the first clock signal and the second clock signal. The threshold difference may be based on a previous evaluation of a known-good integrated circuit. Based on the accessed reference information, method 200 may generate the signal at 250 based on a comparison of the difference calculated at 240 to the threshold difference.

Figure 3:
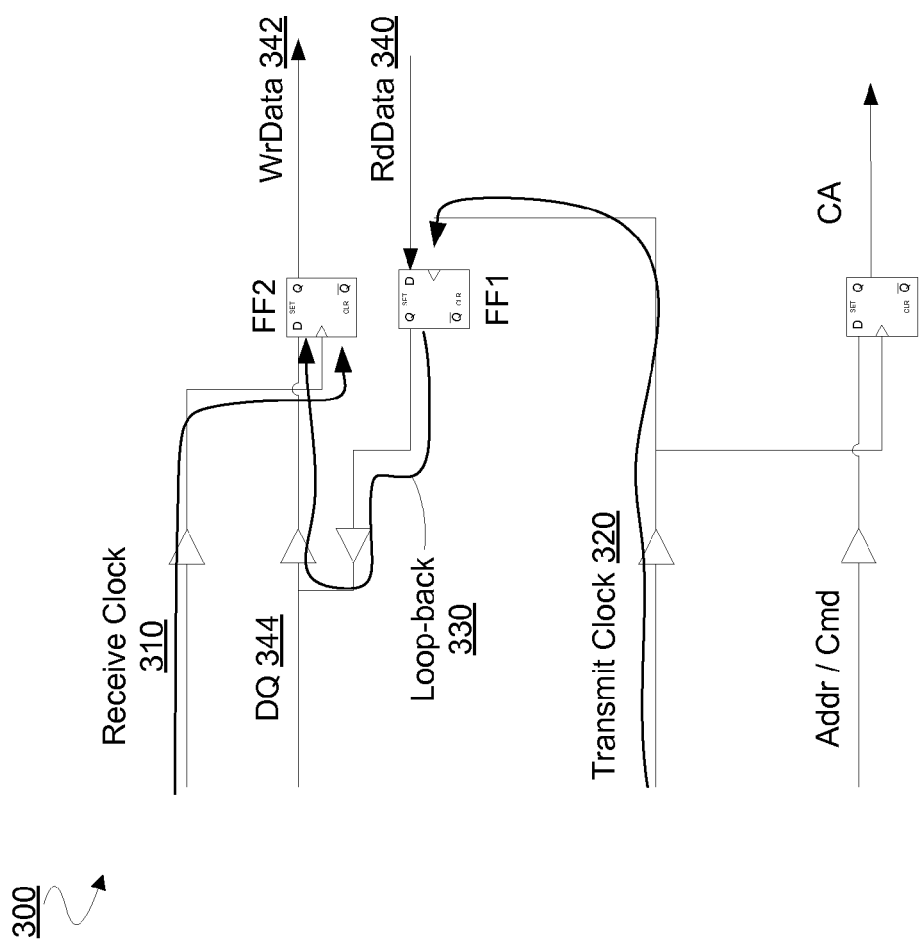
FIG. 3 is a circuit diagram illustrating elements of a loop-back test for evaluating I/O buffer circuitry according to an embodiment.

FIG. 3 illustrates elements of a loopback test 300 according to an embodiment. Loopback test 300 may be one or many loopback tests of a test round for evaluation of an IC. Loopback test 300 may be specific to one I/O buffer circuit of a plurality of I/O buffer circuits of the IC—e.g. where loopback test 300 is specific to one of IOB circuits 122a, 122b, ..., 122n.

In an embodiment, loopback test 300 operates an IOB circuit including flip-flops FF1, FF2 and a data line DQ 344. FF1 may be located along a transmit path of the IOB circuit—e.g. where the transmit path is to provide data to DQ 344. Alternatively or in addition, FF2 may be located along a receive path of the IOB circuit—e.g. where the receive path is to output data from DQ 344. For context, some other features of the IOB circuit are shown in FIG. 3. For example, the IOB circuit may further include a line Addr/Cmd to exchange address and/or command signals CA for coordinating data exchanges via DQ 344. However, certain embodiments may not be limited with respect to such other features of the IOB circuit.

In an embodiment, loopback test 300 includes providing an input data signal RdData 340 to flip-flop FF1. Activation of FF1, to output a value of RdData 340, may be regulated by a transmit clock 320—e.g. where transmit clock 320 is provided to a clock input of FF1. Transmit clock 320 may further be provided to clockout signal CA from Addr/Cmd, for example. In response to transmit clock 320, FF1 may output the value of RdData 340 to DQ 344, which is further coupled to an input of flip-flop FF2. Outputting the value of RdData 340 from FF1 to an output of FF2 may result in a loop-back 330, where such value is ready to be output from FF2 as a value of an output data signal WrData 342. Activation of FF2, to output the value of WrData 342, may be regulated by a receive clock 310.

In an embodiment, circuit logic (not shown)—e.g. including circuitry incorporated into the IC under test and/or residing on test hardware which is separate from the IC—may evaluate performance of the IOB circuit based on a comparison of RdData 340 and WrDate 342 to one another. For example, circuit logic may determine whether the output value of WrData 342 correctly corresponds—e.g. is equal to—the associated input value of RdData 340. Alternatively or in addition, circuit logic may determine whether any such correctly corresponding value of WrData 342 is received on time—e.g. before expiration of some intolerably long delay.

In an embodiment, RdData 340 provides one value to FF1 for loopback test 300 and another value to FF1 for a different loopback test. The two loopback tests may be for the same test round—e.g. where the loopback tests are each performed during the same delay between transmit clock 320 and receive clock 310. Alternatively or in addition, loopback test 300 and another loopback test may be for different test rounds, each corresponding to a different respective delay between transmit clock 320 and receive clock 310.

FIG. 4 illustrates elements of a set of clock signals 400 used for evaluation of an IC according to an embodiment. IC evaluation with set of clock signals 400 may be performed by circuitry which provides some or all of the functionality of test apparatus 110, for example. In an embodiment, such evaluation may be according to method 200.

The set of clock signals 400 includes a signal TxClk 410 for a transmit clock which, for example, may be provided for performing test rounds for a device which includes multiple I/O buffer circuits. In an embodiment, the multiple I/O buffer circuits each comprise a respective transmit path and a respective receive path. TxClk 410 may regulate communication along the respective transmit paths of each of such multiple I/O buffer circuits. By way of illustration and not limitation, TxClk 410 may implement at least in part functionality—such as that provided with transmit clock 320—to latch, clock or otherwise move input data along some portion of a transmit path. To avoid obscuring certain elements of various embodiments, only a portion of one cycle of TxClk 410 is shown in the set of clock signals 400.

Additionally or alternatively, a receive clock may be variously provided for performing test rounds. Such a receive clock may implement at least in part functionality—such as that provided with receive clock 310—to latch, clock or otherwise move output data along some portion of a receive path. In an embodiment, each of the test rounds corresponds to—e.g. is performed during—a different respective difference between such a receive clock and TxClk 410.

The set of signals 400 represents an evaluation, according to an embodiment, in which the phase of the receive clock and the phase of the transmit clock are successively changed relative to one another, each change to set a clock delay for a respective test round. The test rounds may be to performed in a sequence which transitions, for example, from one or more clock delays which each result in an all-pass test round result, to a first clock delay which results in a non-zero failure (at least one failure) test round result, and eventually to a clock delay which results in an all-fail test round result. Such a search may be implemented, for example, with a test software loop which reprograms the receive (and/or transmit) clock edge timing successively over multiple test runs of an evaluation. In an embodiment, the step size change of clock delay is the minimum edge placement resolution of the tester.

The set of clock signals 400 comprises various clock signals for such a receive clock, where each of the various clock signals is for a different respective delay (also referred to as skew, phase difference, etc.) between the receive clock and the TxClk 410. By way of illustration and not limitation, set of clock signals 400 includes receive clock signal RxClk 420 for a delay D0 between the respective signals of the receive clock and TxClk 410. To avoid obscuring certain elements of various embodiments, only a portion of one cycle of RxClk 420 is shown in the set of clock signals 400.

The set of clock signals 400 further includes receive clock signal RxClk 430*a* and receive clock signal RxClk 430*b* for delays D1, D2, respectively, between the respective signals of the receive clock and TxClk 410. To avoid obscuring certain elements of various embodiments, only a portion of each of RxClk 430*a* and RxClk 430*b* are shown in the set of clock signals 400. RxClk 430*a* and RxClk 430*b* may be alternatives to one another—e.g. where RxClk 430*a* and RxClk 430*b* are for different scenarios for an evaluation of the multiple I/O buffer circuits. For example, the set of clock signals 400 may include RxClk 430*a* in a scenario in which the multiple I/O buffer circuits satisfy a test criterion. Alternatively, the set of clock signals 400 may include RxClk 430*b* in a scenario in which the multiple I/O buffer circuits do not satisfy such a test criterion.

In an embodiment, one of the test rounds is performed while the signal of the receive clock and TxClk 410 are offset from one another by delay D0—e.g. where the receive clock signal is RxClk 420. The test round corresponding to delay D0 may, for example, generate results indicating respective instances of a failure condition for each of the multiple I/O buffer circuits. For brevity, such a test round is referred to herein as an all fail condition test round. By contrast, another of the test rounds—for brevity, referred to herein as a non-zero fail condition test round—may indicate the failure condition for at least one of the multiple I/O buffer circuits. The non-zero fail condition test round may, for example, correspond to delay D1 or, in an alternate scenario, delay D2.

In an embodiment, circuit logic such as evaluation logic 106 may calculate a difference between the delay D0 corresponding to an all fail condition test round and a delay corresponding to a non-zero fail condition test round. For example, in a scenario where the non-zero fail condition test round corresponds to delay D1, such logic may calculate a difference 41 equal to (D1−D0). By contrast, in a scenario where the non-zero fail condition test round corresponds to delay D2, such logic may calculate a difference 42 equal to (D2−D0).

Evaluation of the multiple I/O buffer circuits may include determining whether the calculated difference between clock delays is indicative of the multiple I/O buffer circuits failing to satisfy a test criterion. By way of illustration and not limitation, evaluation logic 106 or other such test logic may compare the calculated difference to a threshold difference—e.g. the illustrative threshold difference $\Delta$thr. Where the calculated difference is less than $\Delta$thr—e.g. in the scenario where the calculated difference is $\Delta 1$—the multiple I/O buffer circuits may be characterized as satisfying a test criterion. Alternatively, where the calculated difference is greater than $\Delta$thr—e.g. in the scenario where the calculated difference is $\Delta 2$—the multiple I/O buffer circuits may be characterized as failing to satisfy the test criterion.

Figure 5A:
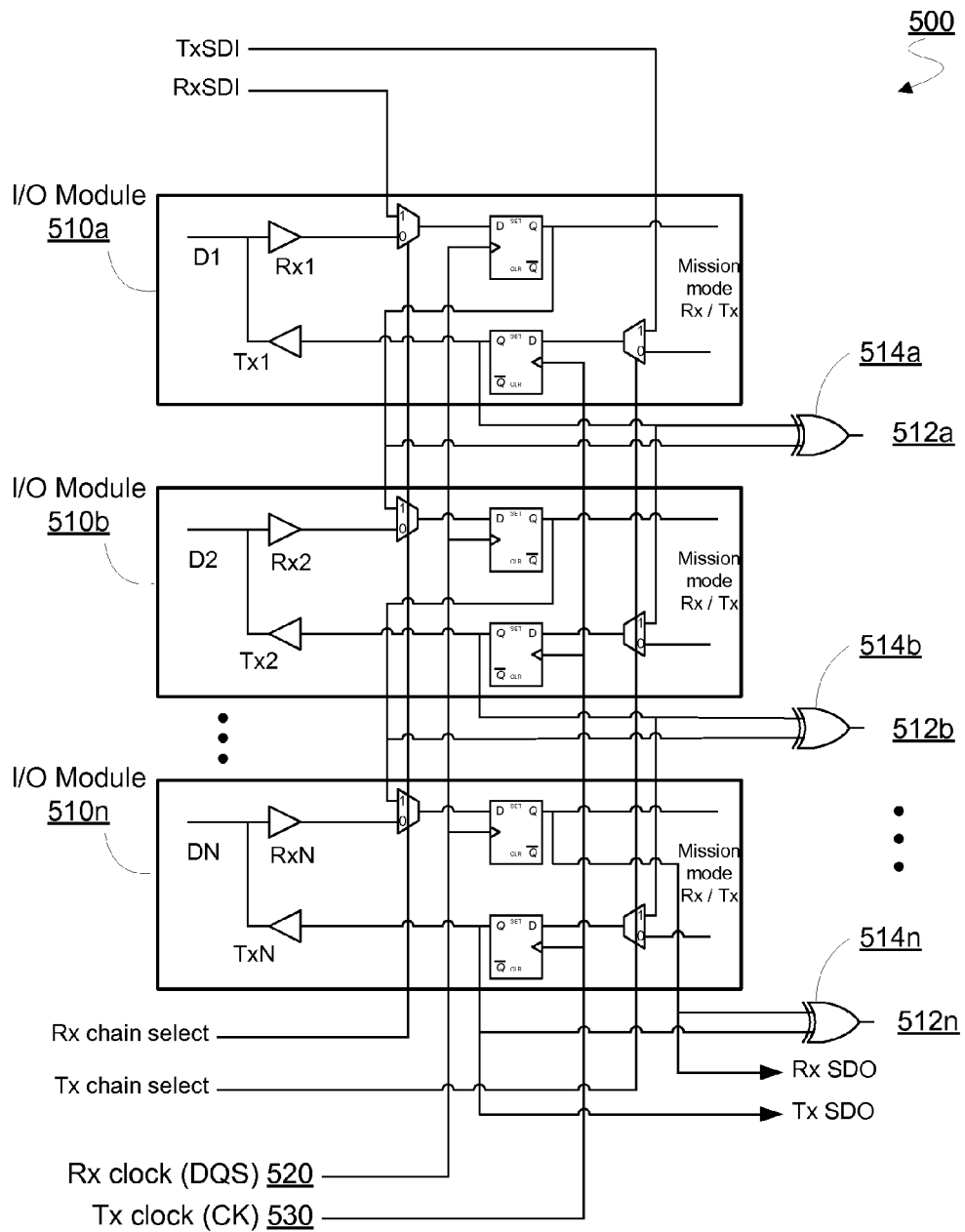
FIG. 5A is a circuit diagram illustrating elements of an integrated circuit to be evaluated according to an embodiment.

FIG. 5A illustrates elements of an integrated circuit 500 which is subject to evaluation according to an embodiment. IC 500 may be evaluated by hardware including some or all of the features of test apparatus 110. In an embodiment, IC 500 is evaluated according to techniques of method 200.

IC 500 may include a plurality of I/O modules 510*a*, 510*b*, . . . , 510*n* each including respective I/O buffer circuitry and logic to implement, at least in part, loop-testing of such I/O buffer circuitry. By way of illustration and not limitation, I/O module 510*a* may include a transmit path Tx1 and a receive path Rx1 each for a data line D1. Additionally or alternatively, I/O module 510*b* may include transmit path Tx2 and receive path Rx2 each for a data line D2, I/O module 510*n* may include transmit path TxN and receive path RxN each for a data line DN, etc.

In an embodiment, IC 500 includes a scan chain implemented at least in part by respective multiplexers of I/O modules 510*a*, 510*b*, . . . , 510*n*, for example. IC 500 may receive test data for test rounds which are to evaluate I/O modules 510*a*, 510*b*, . . . , 510*n*—where such test data is provided via a transmit scan data input TxSDI. A multiplexer of I/O modules 510*a* may receive such test data when the multiplexer is configured by a Tx chain select control signal to output such test data—e.g. as opposed to the multiplexer being configured to exchange data from a mission mode transmit data line. In an embodiment, a loop-back test for I/O module 510a includes clocking a flip-flop of transmit path Tx1 with a transmit clock CK 530 to move test data from the multiplexer toward D1. The loop-back test for I/O module 510a may further include clocking a flip-flop of receive path Rx1 with a receive clock DQS 520 to move output data from D1. A result of a loop-back test for I/O module 510a may be determined by logic of IC 500 which compares data input to Tx1 with data output from Rx1. By way of illustration and not limitation, IC 500 may include an XOR gate 514a to output a signal 512a indicating whether input data is equal to contemporary output data.

In an embodiment, the test data to be input to Tx1 is further sent on from I/O module 510a to I/O module 510b for a similar loopback test for Tx2 and Rx2. Such test data may be sent on through successive I/O modules—e.g. until I/O module 510n. A loop-back test for I/O module 510b may include clocking a flip-flop of Tx2 with CK 530 to move test data toward D2, and further clocking a flip-flop of Rx2 with DQS 520 to move output data from D2. Similarly, a loop-back test for I/O module 510n may include clocking a flip-flop of TxN with CK 530 to move test data toward DN, and further clocking a flip-flop of RxN with DQS 520 to move output data from DN. A result of a loop-back test for I/O module 510b may be determined by an XOR gate 514b generating a signal 512b indicating whether data input to Tx2 is equal to contemporary data output from Rx2. Alternatively or in addition, a result of a loop-back test for I/O module 510n may be determined by an XOR gate 514n generating a signal 512n indicating whether data input to TxN is equal to contemporary data output from RxN.

In other architectures, a full scan chain for a set of I/O modules may be loaded with data concurrently, where a concurrent launch and capture of all such data is performed with a single transmit clock pulse followed by a single time receive clock pulse. Results of such a launch and capture may XOR compared in parallel with their corresponding input data, or the receive scan chain could be shifted out for evaluation of the specific received data bits. Certain embodiments are not limited with respect to the particular order of scan chain loading and/or offloading.

IC 500 may include other circuitry for additional testing of I/O modules 510a, 510b, . . . , 510n. For example, a receive scan data input RxSDI may provide other test data to receive path Rx1, where such data is successively shifted through to each of Rx2, . . . , RxN in response to DQS 520. Such shifting of receive scan input data from RxSDI—e.g. in combination with transmit scan input data from TxSDI—may provide for more specific identification of faulty circuitry in I/O modules 510a, 510b, . . . , 510n. The various shifting of data from TxSDI and/or data from RxSDI through I/O modules 510a, 510b, . . . , 510n may be selectively controlled by an Rx chain select control signal and the Tx chain select control signal.

Figure 5B:
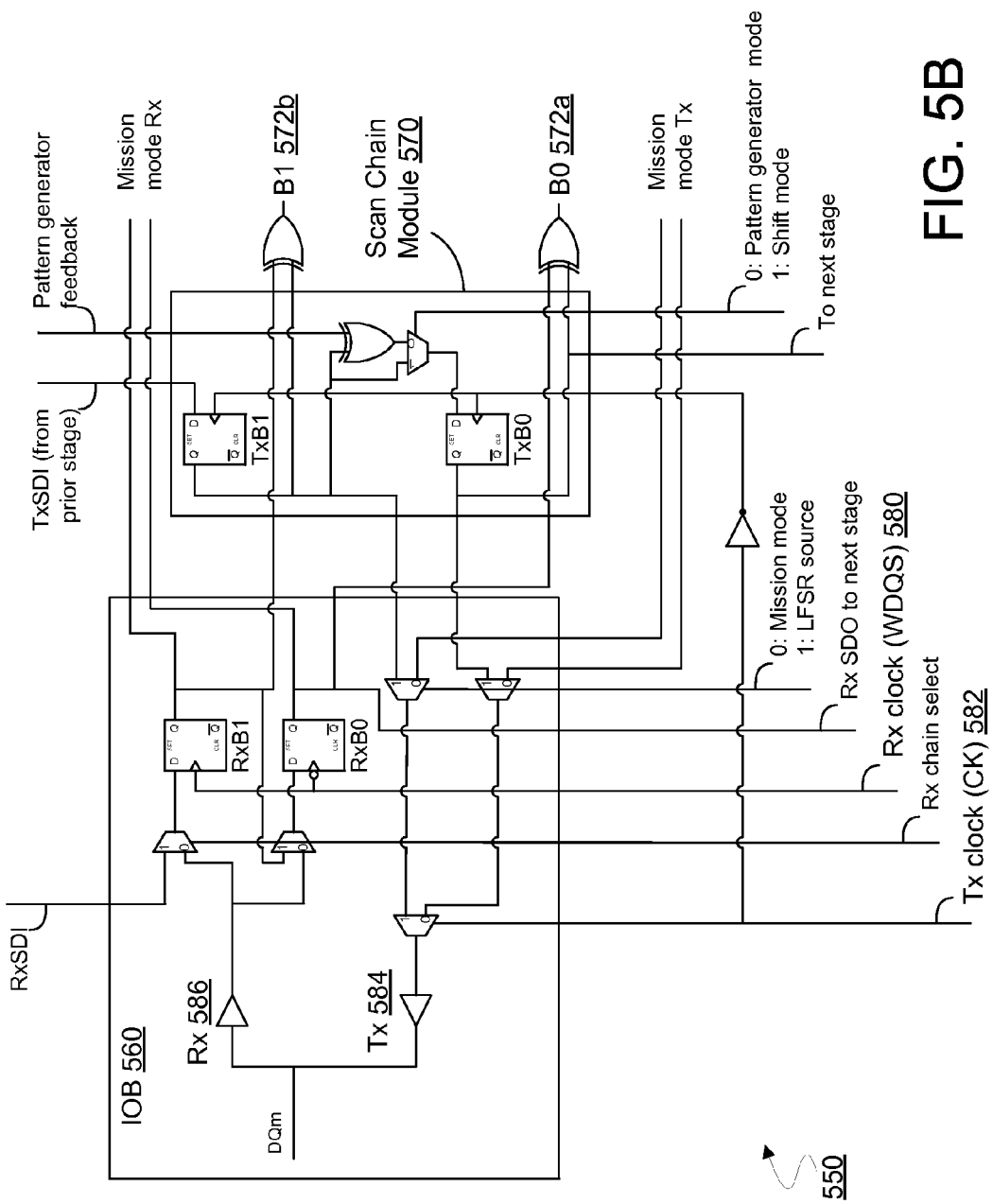
FIG. 5B is a circuit diagram illustrating elements of an integrated circuit to be evaluated according to an embodiment.
Figure 6:
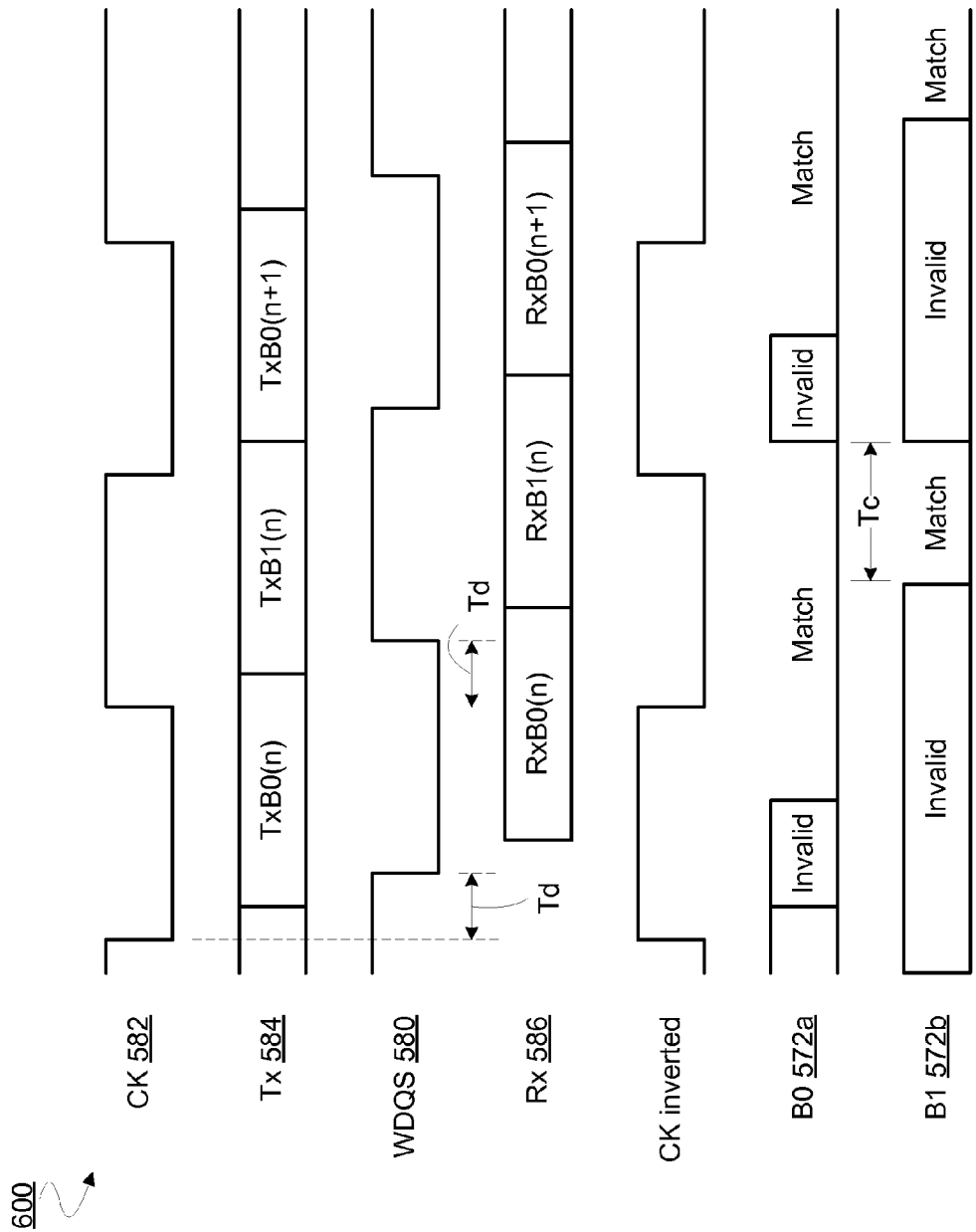
FIG. 6 is a timing diagram illustrating elements of signaling to be processed for evaluation of an integrated circuit according to an embodiment.

FIG. 5B illustrates elements of an integrated circuit 550 which is subject to evaluation according to an embodiment. IC 550 may be evaluated by hardware including some or all of the features of test apparatus 110. In an embodiment, IC 550 is evaluated according to techniques of method 200. FIG. 6 illustrates elements of a plurality of signals 600 for operation of IC 550 according to an embodiment.

IC 550 may include an I/O buffer circuit IOB 560 and a scan chain module 570 to implement, at least in part, loop-testing of IOB 560. IOB 560 may be a dual data rate (DDR) device including logic to support two different mission mode data transmit channels and two different mission mode data receive channels. Such receive channels and transmit channels may function in respective receive/transmit line pairs.

IOB 560 may include a transmit path Tx 584 and a receive path Rx 586 each for a data line DQm. In an embodiment, IC 550 includes a scan chain implemented at least in part by scan chain module 570. For example, scan chain module 570 may receive—e.g. via a transmit scan data input TxSDI (from a previous stage of the scan chain)—test data for multiple test rounds to evaluate IOB 560. A flip-flop TxB1 of scan chain module 570 may receive such test data. In response to a transmit clock CK 582, TxB1 may output such test data toward Tx 584. The test data output from TxB1 may be received at a flip-flop TxB0 of scan chain module 570. TxB0 may also output test data toward Tx 584 in response to a transmit clock CK 582. In an embodiment, Tx 584 is multiplexed between receiving test data from TxB1 and receiving test data from TxB0—e.g. where such multiplexing is in response to a transmit clock CK 582.

Data carried in Tx 584 may directly loopback to receive path Rx 586—e.g. where a flip-flop RxB1 of IOB 560 receives data carried in receive path Rx 586. In response to a receive clock WDQS 580, RxB1 may output such data toward an XOR gate which is for generating a signal B1 572b. The data output from RxB1 may also be received at a flip-flop RxB0 of IOB 560. RxB0 may also output such data in response to receive clock WDQS 580, where the output from RxB0 is toward an XOR gate which is for generating a signal B0 572a. The XOR gates have relevant test results after a CK launch and WDQS capture cycle. An inverted CK 582 may update LFSR logic built into the transmit scan chain to generate new data for the next CK launch and WDQS capture test cycle. In an embodiment, signal B0 572a determines a result of a loopback test for one receive/transmit line pair for IOB 560. Alternatively or in addition, signal B1 572b may determine a result of a loopback test for the other receive/transmit line pair for IOB 560.

As shown in FIG. 6, a given test round may be performed in an embodiment, while there is some delay Td between CK 582 and WDQS 580. During such a test round, B0 572a may transition from Invalid (e.g. indeterminate logic high or low) to Match (e.g. logic low or "0") in response to Rx 586 outputting data RxB0(n) which is equal to data TxB0(n) which was input to Tx 584. Similarly, B1 572b may transition from Invalid to Match in response to Rx 586 outputting data RxB1 (n) which is equal to data TxB1(n) which was input to Tx 584. B0 572a and B1 572b may each be changed to Invalid by a transition of CK 582 shifting different test data into Tx 584. In an embodiment, B0 572a and B1 572b may be sampled during a common time period Tc when the two signals are capable of being in respective Match states.

A loopback test of IOB 560 may fail if B0 572a does not transition to Match before a transition of CK 582 would change any such Match of B0 572a to Invalid. Similarly, a loopback test of IOB 560 may fail if B1 572b does not transition to Match before a transition of CK 582 would change any such Match of B1 572b to Invalid.

In an embodiment, scan chain module 570 includes logic for the scan chain to operate as a linear feedback shift register (LFSR). By way of illustration and not limitation, scan chain module 570 may include an XOR gate to receive a pattern generator feedback signal and data provided via TxB1. An output of the XOR gate is the XOR of the TxB1 and the pattern generator feedback from elsewhere in the LFSR. The output of the XOR gate may be provided to a multiplexer which, based on a mode control signal, determines whether TxB0 is to receive the output of the XOR gate or the data provided by TxB1. When a Pattern Generator mode is set, the data loaded to TxB0 is the output of the XOR. A series of scan chain modules logically equivalent to scan chain module 570 may implement a LFSR, in an embodiment.

IC 550 may include other circuitry for additional testing of IOB 560, although certain embodiments are not limited with respect to such other circuitry. For example, a receive scan data input RxSDI may provide other test data to receive path Rx 586, where such data is successively shifted through RxB1 and RxB0, and to any next stage in the scan chain. Such shifting of receive scan input data from RxSDI—e.g. in combination with transmit scan input data from TxSDI—may provide for specific identification of faulty circuitry in IOB 560. The Rx chain select control signal for IC 550 may control whether RxB0 and RxB1 is to receive data from RxSDI or data provided via Tx 584.

Figure 7:
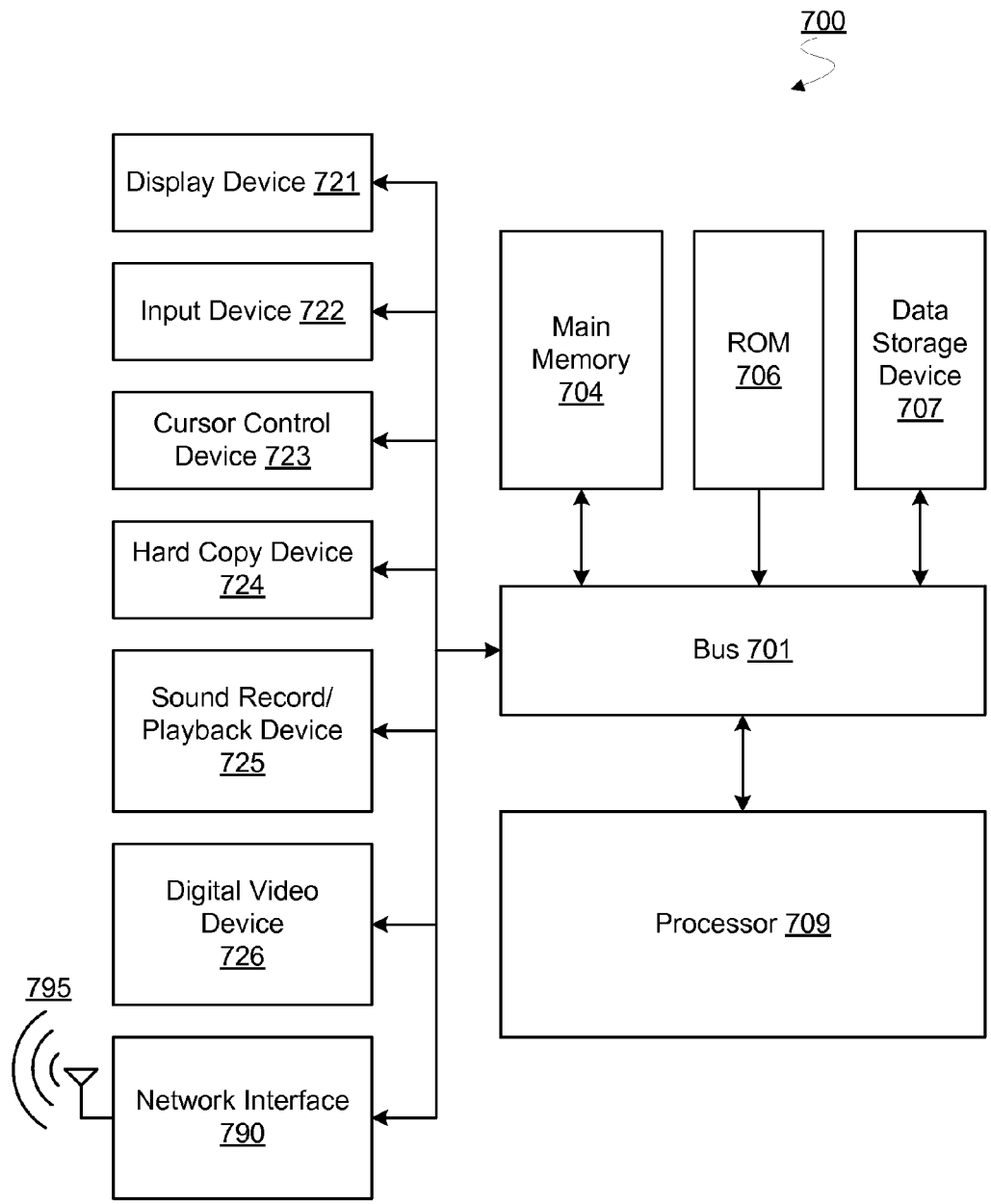
FIG. 7 is a block diagram illustrating elements of a system to evaluate an integrated circuit according to an embodiment.

FIG. 7 shows elements of an illustrative computer platform 700 for evaluating an integrated circuit according to one embodiment. Computer platform 700 may, for example, include a hardware platform of a computer such as a server, workstation, desktop computer, laptop computer, a handheld computer—e.g. a tablet, palmtop, cell phone, media player, and/or the like—and/or other such computer system.

In an embodiment, computer platform 700 includes at least one interconnect, represented by an illustrative bus 701, for communicating information and a processor 709—e.g. a central processing unit—for processing such information. Processor 709 may include functionality of a complex instruction set computer (CISC) type architecture, a reduced instruction set computer (RISC) type architecture and/or any of a variety of processor architecture types. Processor 709 may couple with one or more other components of computer platform 700 via bus 701. By way of illustration and not limitation, computer platform 700 may include a random access memory (RAM) or other dynamic storage device, represented by an illustrative main memory 704 coupled to bus 701, to store information and/or instructions to be executed by processor 709. Main memory 704 also may be used for storing temporary variables or other intermediate information during execution of instructions by processor 709. Computer platform 700 may additionally or alternatively include a read only memory (ROM) 706, and/or other static storage device—e.g. where ROM 706 is coupled to processor 709 via bus 701—to store static information and/or instructions for processor 709.

In an embodiment, computer platform 700 additionally or alternatively includes a data storage device 707 (e.g., a magnetic disk, optical disk, and/or other machine readable media) coupled to processor 709—e.g. via bus 701. Data storage device 707 may, for example, include instructions or other information to be operated on and/or otherwise accessed by processor 709. In an embodiment, processor 709 may perform an evaluation of an integrated circuit of another device (not shown) coupled thereto.

Computer platform 700 may additionally or alternatively include a display device 721 for displaying information to a computer user. Display device 721 may, for example, include a frame buffer, a specialized graphics rendering device, a cathode ray tube (CRT), a flat panel display and/or the like. Additionally or alternatively, computer platform 700 may include an input device 722—e.g. including alphanumeric and/or other keys to receive user input. Additionally or alternatively, computer platform 700 may include a cursor control device 723, such as a mouse, a trackball, a pen, a touch screen, or cursor direction keys to communicate position, selection or other cursor information to processor 709, and/or to control cursor movement—e.g. on display device 721.

Computer platform 700 may additionally or alternatively have a hard copy device 724 such as a printer to print instructions, data, or other information on a medium such as paper, film, or similar types of media. Additionally or alternatively, computer platform 700 may include a sound record/playback device 725 such as a microphone or speaker to receive and/or output audio information. Computer platform 700 may additionally or alternatively include a digital video device 726 such as a still or motion camera to digitize an image. In an embodiment, computer platform 700 further comprises a network interface 790 to couple computer platform 700 to a network—e.g. where network interface 790 includes or couples to one or more antennae 795 for wireless network communications.

In one aspect, an apparatus comprises test control logic to perform test rounds for a device including I/O buffer circuits which each comprise a respective transmit path and a respective receive path, each of the test rounds comprising a respective loop-back test for each of the I/O buffer circuits, each of the test rounds corresponding to a different respective delay between a first clock signal and a second clock signal. The first clock signal is to regulate communication along the respective transmit paths of each of the I/O buffer circuits, and the second clock signal is to regulate communication along the respective receive paths of each of the I/O buffer circuits. The apparatus further comprises fail detect logic to determine that a first test round of the test rounds indicates a failure condition for at least one I/O buffer circuit of the I/O buffer circuits, and to determine that a second test round of the test rounds indicates the failure condition for each of the I/O buffer circuits. The apparatus further comprises evaluation logic to calculate a difference between the delay corresponding to the first test round and the delay corresponding to the second test round, and to generate, based on the difference, a signal indicating whether the device satisfies a test criterion.

In an embodiment, the evaluation logic is further to perform a comparison of the difference to a threshold difference, wherein the evaluation logic to generate the signal based on the difference includes the evaluation logic to generate the signal based on the comparison. In an embodiment, the first test round includes a first set of loop-back tests each for a first I/O buffer circuit, wherein the fail detect logic to determine that the first test round indicates the failure condition for the at least one I/O buffer circuit includes the fail detect logic to determine that the first test round indicates failure of at least one of the first set of loop-back tests. In an embodiment, the first test round includes a first set of loop-back tests each for a first I/O buffer circuit, wherein the fail detect logic to determine that the first test round indicates the failure condition for the at least one I/O buffer circuit includes the fail detect logic to determine that the first test round indicates a respective failure of each of the first set of loop-back tests.

In an embodiment, the test control logic to perform the test rounds includes the test control logic to send test data to a series of scan chain modules which each correspond to a respective one of the I/O buffer circuits. In an embodiment, the series of scan chain modules operates as a linear feedback shift register (LFSR). In an embodiment, the device comprises the series of scan chain modules. In an embodiment, the device includes a dynamic random access memory.

In another aspect, a system comprises test control logic to perform test rounds for a device including I/O buffer circuits which each comprise a respective transmit path and a respective receive path, each of the test rounds comprising a respective loop-back test for each of the I/O buffer circuits, each of the test rounds corresponding to a different respective delay between a first clock signal and a second clock signal. The first clock signal is to regulate communication along the respective transmit paths of each of the I/O buffer circuits, and the second clock signal is to regulate communication along the respective receive paths of each of the I/O buffer circuits The system further comprises fail detect logic to determine that a first test round of the test rounds indicates a failure condition for at least one I/O buffer circuit of the I/O buffer circuits, and to determine that a second test round of the test rounds indicates the failure condition for each of the I/O buffer circuits. The system further comprises evaluation logic to calculate a difference between the delay corresponding to the first test round and the delay corresponding to the second test round, and to generate, based on the difference, a signal indicating whether the device satisfies a test criterion. The system further comprises a display unit to display a representation of whether the device satisfies the test criterion.

In an embodiment, the evaluation logic is further to perform a comparison of the difference to a threshold difference, wherein the evaluation logic to generate the signal based on the difference includes the evaluation logic to generate the signal based on the comparison. In an embodiment, the first test round includes a first set of loop-back tests each for a first I/O buffer circuit, wherein the fail detect logic to determine that the first test round indicates the failure condition for the at least one I/O buffer circuit includes the fail detect logic to determine that the first test round indicates failure of at least one of the first set of loop-back tests. In an embodiment, the first test round includes a first set of loop-back tests each for a first I/O buffer circuit, wherein the fail detect logic to determine that the first test round indicates the failure condition for the at least one I/O buffer circuit includes the fail detect logic to determine that the first test round indicates a respective failure of each of the first set of loop-back tests.

In an embodiment, the test control logic to perform the test rounds includes the test control logic to send test data to a series of scan chain modules which each correspond to a respective one of the I/O buffer circuits. In an embodiment, the series of scan chain modules operates as a linear feedback shift register (LFSR). In an embodiment, the device includes a dynamic random access memory.

In another aspect, a method comprises performing test rounds for a device including I/O buffer circuits which each comprise a respective transmit path and a respective receive path, each of the test rounds comprising a respective loop-back test for each of the I/O buffer circuits, each of the test rounds corresponding to a different respective delay between a first clock signal and a second clock signal. The first clock signal is to regulate communication along the respective transmit paths of each of the I/O buffer circuits, and the second clock signal is to regulate communication along the respective receive paths of each of the I/O buffer circuits. The method further comprises determining that a first test round of the test rounds indicates a failure condition for at least one I/O buffer circuit of the I/O buffer circuits, and determining that a second test round of the test rounds indicates the failure condition for each of the I/O buffer circuits. The method further comprises calculating a difference between the delay corresponding to the first test round and the delay corresponding to the second test round, and based on the difference, generating a signal indicating whether the device satisfies a test criterion.

In an embodiment, the method further comprises performing a comparison of the difference to a threshold difference, wherein generating the signal based on the difference includes generating the signal based on the comparison. In an embodiment, the first test round includes a first set of loop-back tests each for a first I/O buffer circuit, wherein determining that the first test round indicates the failure condition for the at least one I/O buffer circuit includes determining that the first test round indicates failure of at least one of the first set of loop-back tests. In an embodiment, the first test round includes a first set of loop-back tests each for a first I/O buffer circuit, wherein determining that the first test round indicates the failure condition for the at least one I/O buffer circuit includes determining that the first test round indicates a respective failure of each of the first set of loop-back tests.

In an embodiment, performing the test rounds includes sending test data to a series of scan chain modules which each correspond to a respective one of the I/O buffer circuits. In an embodiment, the series of scan chain modules operates as a linear feedback shift register (LFSR). In an embodiment, the device comprises the series of scan chain modules. In an embodiment, the device includes a dynamic random access memory.

In another aspect, a computer-readable storage medium has stored thereon instructions which, when executed by one or more processing units, cause the one or more processing units to perform a method. The method comprises performing test rounds for a device including I/O buffer circuits which each comprise a respective transmit path and a respective receive path, each of the test rounds comprising a respective loop-back test for each of the I/O buffer circuits, each of the test rounds corresponding to a different respective delay between a first clock signal and a second clock signal. The first clock signal is to regulate communication along the respective transmit paths of each of the I/O buffer circuits, and the second clock signal is to regulate communication along the respective receive paths of each of the I/O buffer circuits. The method further comprises determining that a first test round of the test rounds indicates a failure condition for at least one I/O buffer circuit of the I/O buffer circuits, and determining that a second test round of the test rounds indicates the failure condition for each of the I/O buffer circuits. The method further comprises calculating a difference between the delay corresponding to the first test round and the delay corresponding to the second test round, and based on the difference, generating a signal indicating whether the device satisfies a test criterion.

In an embodiment, the method further comprises performing a comparison of the difference to a threshold difference, wherein generating the signal based on the difference includes generating the signal based on the comparison. In an embodiment, the first test round includes a first set of loop-back tests each for a first I/O buffer circuit, wherein determining that the first test round indicates the failure condition for the at least one I/O buffer circuit includes determining that the first test round indicates failure of at least one of the first set of loop-back tests. In an embodiment, the first test round includes a first set of loop-back tests each for a first I/O buffer circuit, wherein determining that the first test round indicates the failure condition for the at least one I/O buffer circuit includes determining that the first test round indicates a respective failure of each of the first set of loop-back tests.

In an embodiment, performing the test rounds includes sending test data to a series of scan chain modules which each correspond to a respective one of the I/O buffer circuits. In an embodiment, the series of scan chain modules operates as a linear feedback shift register (LFSR). In an embodiment, the device includes a dynamic random access memory.

Techniques and architectures for testing an integrated circuit are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. An apparatus comprising:
    test control logic to perform test rounds for a device including I/O buffer circuits which each comprise a respective transmit path and a respective receive path, each of the test rounds comprising a respective loop-back test for each of the I/O buffer circuits, each of the test rounds corresponding to a different respective delay between a first clock signal and a second clock signal, the first clock signal to regulate communication along the respective transmit paths of each of the I/O buffer circuits, the second clock signal to regulate communication along the respective receive paths of each of the I/O buffer circuits;
    fail detect logic to determine that a first test round of the test rounds indicates a failure condition for at least one I/O buffer circuit of the I/O buffer circuits, and to determine that a second test round of the test rounds indicates the failure condition for each of the I/O buffer circuits; and
    evaluation logic to calculate a difference between the delay corresponding to the first test round and the delay corresponding to the second test round, and to generate, based on the difference, a signal indicating whether the device satisfies a test criterion.

2. The apparatus of claim 1, the evaluation logic further to perform a comparison of the difference to a threshold difference, wherein the evaluation logic to generate the signal based on the difference includes the evaluation logic to generate the signal based on the comparison.

3. The apparatus of claim 1, wherein the first test round includes a first set of loop-back tests each for a first I/O buffer circuit, and wherein the fail detect logic to determine that the first test round indicates the failure condition for the at least one I/O buffer circuit includes the fail detect logic to determine that the first test round indicates failure of at least one of the first set of loop-back tests.

4. The apparatus of claim 1, wherein the first test round includes a first set of loop-back tests each for a first I/O buffer circuit, and wherein the fail detect logic to determine that the first test round indicates the failure condition for the at least one I/O buffer circuit includes the fail detect logic to determine that the first test round indicates a respective failure of each of the first set of loop-back tests.

5. The apparatus of claim 1, wherein the test control logic to perform the test rounds includes the test control logic to send test data to a series of scan chain modules which each correspond to a respective one of the I/O buffer circuits.

6. The apparatus of claim 5, wherein the series of scan chain modules operates as a linear feedback shift register (LFSR).

7. The apparatus of claim 5, wherein the device comprises the series of scan chain modules.

8. The apparatus of claim 1, wherein the device includes a dynamic random access memory.

9. A system comprising:
    test control logic to perform test rounds for a device including I/O buffer circuits which each comprise a respective transmit path and a respective receive path, each of the test rounds comprising a respective loop-back test for each of the I/O buffer circuits, each of the test rounds corresponding to a different respective delay between a first clock signal and a second clock signal, the first clock signal to regulate communication along the respective transmit paths of each of the I/O buffer circuits, the second clock signal to regulate communication along the respective receive paths of each of the I/O buffer circuits;

fail detect logic to determine that a first test round of the test rounds indicates a failure condition for at least one I/O buffer circuit of the I/O buffer circuits, and to determine that a second test round of the test rounds indicates the failure condition for each of the I/O buffer circuits; and evaluation logic to calculate a difference between the delay corresponding to the first test round and the delay corresponding to the second test round, and to generate, based on the difference, a signal indicating whether the device satisfies a test criterion; and a display unit to display a representation of whether the device satisfies the test criterion.

10. The system of claim 9, the evaluation logic further to perform a comparison of the difference to a threshold difference, wherein the evaluation logic to generate the signal based on the difference includes the evaluation logic to generate the signal based on the comparison.

11. The system of claim 9, wherein the first test round includes a first set of loop-back tests each for a first I/O buffer circuit, and wherein the fail detect logic to determine that the first test round indicates the failure condition for the at least one I/O buffer circuit includes the fail detect logic to determine that the first test round indicates failure of at least one of the first set of loop-back tests.

12. The system of claim 9, wherein the first test round includes a first set of loop-back tests each for a first I/O buffer circuit, and wherein the fail detect logic to determine that the first test round indicates the failure condition for the at least one I/O buffer circuit includes the fail detect logic to determine that the first test round indicates a respective failure of each of the first set of loop-back tests.

13. The system of claim 9, wherein the test control logic to perform the test rounds includes the test control logic to send test data to a series of scan chain modules which each correspond to a respective one of the I/O buffer circuits.

14. The system of claim 13, wherein the series of scan chain modules operates as a linear feedback shift register (LFSR).

15. The system of claim 9, wherein the device includes a dynamic random access memory.

16. A method comprising:
performing test rounds for a device including I/O buffer circuits which each comprise a respective transmit path and a respective receive path, each of the test rounds comprising a respective loop-back test for each of the I/O buffer circuits, each of the test rounds corresponding to a different respective delay between a first clock signal and a second clock signal, the first clock signal to regulate communication along the respective transmit paths of each of the I/O buffer circuits, the second clock signal to regulate communication along the respective receive paths of each of the I/O buffer circuits;

determining that a first test round of the test rounds indicates a failure condition for at least one I/O buffer circuit of the I/O buffer circuits;

determining that a second test round of the test rounds indicates the failure condition for each of the I/O buffer circuits;

calculating a difference between the delay corresponding to the first test round and the delay corresponding to the second test round; and based on the difference, generating a signal indicating whether the device satisfies a test criterion.

17. The method of claim 16, further comprising performing a comparison of the difference to a threshold difference, wherein generating the signal based on the difference includes generating the signal based on the comparison.

18. The method of claim 16, wherein the first test round includes a first set of loop-back tests each for a first I/O buffer circuit, and wherein determining that the first test round indicates the failure condition for the at least one I/O buffer circuit includes determining that the first test round indicates failure of at least one of the first set of loop-back tests.

19. The method of claim 16, wherein the first test round includes a first set of loop-back tests each for a first I/O buffer circuit, and wherein determining that the first test round indicates the failure condition for the at least one I/O buffer circuit includes determining that the first test round indicates a respective failure of each of the first set of loop-back tests.

20. The method of claim 16, wherein performing the test rounds includes sending test data to a series of scan chain modules which each correspond to a respective one of the I/O buffer circuits.

21. The method of claim 20, wherein the series of scan chain modules operates as a linear feedback shift register (LFSR).

22. The method of claim 20, wherein the device comprises the series of scan chain modules.

23. The method of claim 16, wherein the device includes a dynamic random access memory.

24. A non-transitory computer-readable storage medium having stored thereon instructions which, when executed by one or more processing units, cause the one or more processing units to perform a method comprising:
performing test rounds for a device including I/O buffer circuits which each comprise a respective transmit path and a respective receive path, each of the test rounds comprising a respective loop-back test for each of the I/O buffer circuits, each of the test rounds corresponding to a different respective delay between a first clock signal and a second clock signal, the first clock signal to regulate communication along the respective transmit paths of each of the I/O buffer circuits, the second clock signal to regulate communication along the respective receive paths of each of the I/O buffer circuits;

determining that a first test round of the test rounds indicates a failure condition for at least one I/O buffer circuit of the I/O buffer circuits;

determining that a second test round of the test rounds indicates the failure condition for each of the I/O buffer circuits;

calculating a difference between the delay corresponding to the first test round and the delay corresponding to the second test round; and based on the difference, generating a signal indicating whether the device satisfies a test criterion.

25. The non-transitory computer-readable storage medium of claim 24, the method further comprising performing a comparison of the difference to a threshold difference, wherein generating the signal based on the difference includes generating the signal based on the comparison.

26. The non-transitory computer-readable storage medium of claim 24, wherein the first test round includes a first set of loop-back tests each for a first I/O buffer circuit, and wherein determining that the first test round indicates the failure condition for the at least one I/O buffer circuit includes determining that the first test round indicates failure of at least one of the first set of loop-back tests.

27. The non-transitory computer-readable storage medium of claim 24, wherein the first test round includes a first set of loop-back tests each for a first I/O buffer circuit, and wherein determining that the first test round indicates the failure condition for the at least one I/O buffer circuit includes determining that the first test round indicates a respective failure of each of the first set of loop-back tests.

28. The non-transitory computer-readable storage medium of claim 24, wherein performing the test rounds includes sending test data to a series of scan chain modules which each correspond to a respective one of the I/O buffer circuits.

29. The non-transitory computer-readable storage medium of claim 28, wherein the series of scan chain modules operates as a linear feedback shift register (LFSR).

30. The non-transitory computer-readable storage medium of claim 24, wherein the device includes a dynamic random access memory.

* * * * *